United States Patent
Furuya et al.

(10) Patent No.: US 7,800,229 B2
(45) Date of Patent: Sep. 21, 2010

(54) SEMICONDUCTOR DEVICE AND METHOD FOR MANUFACTURING SAME

(75) Inventors: Akira Furuya, Kanagawa (JP); Koji Arita, Kanagawa (JP); Tetsuya Kurokawa, Kanagawa (JP); Kaori Noda, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 892 days.

(21) Appl. No.: 11/704,950

(22) Filed: Feb. 12, 2007

(65) Prior Publication Data

US 2007/0190341 A1    Aug. 16, 2007

(30) Foreign Application Priority Data

Feb. 14, 2006   (JP)   ............... 2006-036921

(51) Int. Cl.
*H01L 23/48* (2006.01)
*H01L 23/52* (2006.01)

(52) U.S. Cl. .................. 257/762; 257/765; 257/774; 438/629; 438/637

(58) Field of Classification Search ........... 257/762, 257/765, 774, E23.145; 438/629, 637
See application file for complete search history.

(56) References Cited

U.S. PATENT DOCUMENTS 7,019,399 B2 *   3/2006   Venkatraman et al. ...... 257/751

2005/0042889 A1 *   2/2005   Lee et al. .................... 438/780

FOREIGN PATENT DOCUMENTS

| JP | 11-45887 | 2/1999 |
|---|---|---|
| JP | 2000-174025 | 6/2000 |
| JP | 2003-129285 | 5/2003 |
| JP | 2003-142426 | 5/2003 |
| JP | 2003-328180 | 11/2003 |
| JP | 2004-158897 | 6/2004 |
| JP | 2005-256178 | 9/2005 |

OTHER PUBLICATIONS

C.H. Shih et al., Design of ECP (Electrochemical Plating) Additive for 65 NM-Node Technology CU Beol Reliability, p. 1-3.

* cited by examiner

*Primary Examiner*—Theresa T Doan
(74) *Attorney, Agent, or Firm*—Young & Thompson

(57) ABSTRACT

An improved SIV resistance and an improved EM resistance are achieved in the coupling structure containing copper films. A semiconductor device includes: a semiconductor substrate; a second insulating layer formed on or over the semiconductor substrate; a second barrier metal film, formed on the second insulating film, and being capable of preventing copper from diffusing into the second insulating film; and an electrically conducting film formed on the second barrier metal film so as to be in contact with the second barrier metal film, and containing copper and carbon, wherein a distribution of carbon concentration along a depositing direction in the second electrically conducting film includes a first peak and a second peak.

6 Claims, 9 Drawing Sheets

250deg 30sec $N_2/H_2$

350deg 30sec $N_2/H_2$

250deg 30sec N$_2$/H$_2$

350deg 30sec N$_2$/H$_2$

350deg 30min N$_2$
(furnace)

250deg 30sec $N_2/H_2$

350deg 30sec $N_2/H_2$

350deg 30min $N_2$
(furnace)

SEMICONDUCTOR DEVICE AND METHOD FOR MANUFACTURING SAME

This application is based on Japanese patent application No. 2006-36,921, the content of which is incorporated hereinto by reference.

BACKGROUND

1. Technical Field

The present invention relates to a semiconductor device and a method for manufacturing thereof.

2. Related Art

In semiconductor devices of recent years, a delay in signal propagation through an interconnect restricts an operating speed of electronic elements. A delay constant in signal propagation through an interconnect is represented by a product of an interconnect resistance and an interconnect capacitance. Therefore, in order to achieve faster operation of elements, a low dielectric constant material having lower dielectric constant than a conventional silicon dioxide film ($SiO_2$) is employed for an interlayer insulating film, and copper (Cu) having lower electrical resistivity is employed for an interconnect.

A multiple-layered interconnect employing copper as an interconnect material is formed by a damascene process. In typical damascene process, a concave portion such as an interconnect trench or a via hole is formed in an interlayer insulating film, and then a barrier metal film is deposited in the concave portion, and the concave portion is further plugged with a copper film, and thereafter, portions of the copper film and the barrier metal film deposited outside of the concave portion are removed by a chemical mechanical polishing (CMP) process to obtain a copper interconnect or a copper via. The copper film is formed by, first of all, forming a copper thin film serving as a seed layer in the concave portion, and then filling the concave portion with the copper film utilizing the copper thin film as a cathode electrode for an electrolytic plating process.

Technologies for providing an improved electromigration resistance of the copper film are disclosed in Japanese Laid-open patent publication No. 2004-158,897, Japanese Laid-open patent publication No. H11-45,887 (1999) and Japanese Laid-open patent publication No. 2000-174,025. Japanese Laid-open patent publication No. 2004-158,897 discloses a method for forming an electric conductor by ion-implanting an impurity such as carbon (C) and the like into a seed layer of copper, and then performing an electrolytic plating process for copper. It is described that such procedure-provides an improved electromigration resistance of an electric conductor composed of copper.

Japanese Laid-open patent publication No. H11-45,887 discloses a procedure by providing a copper coupling structure that employs a layer containing a copper and another metal material as a seed layer.

Japanese Laid-open patent publication No. 2000-174,025 discloses a configuration having an impurity film containing carbon or the like between copper films. The impurity film is formed by maintaining a status of a substrate being immersed into a plating solution.

Japanese Laid-open patent publication No. 2005-256,178, Japanese Laid-open patent publication No. 2003-142,426 and Japanese Laid-open patent publication No. 2003-129,285 disclose methods that involve performing an electroplating process utilizing a relatively lower current density in initial stage, and then performing an electroplating process utilizing a relatively higher current density, when trenches are filled with a plated copper. It is described that such procedure provides a prevention from generating voids.

Japanese Laid-open patent publication No. 2003-328,180 discloses a configuration employing a plating solution that contains an inhibitor containing polyethylene glycol having molecular weight of 2,000 to 40,000. It is described that such configuration provides a prevention from generating voids even if the via hole has higher aspect ratio.

Meanwhile, C. H. Shih et al, entitled "Design of ECP additive for 65 nm-node technology Cu BEOL reliability", Proceedings of the IEEE 2005 International Interconnect Technology Conference (IEEE Cat. No. 05TH8780), IEEE, Piscataway, N.J., USA, 6-8 Jun. 2005, pp. 102-104, discloses that impurity in copper film formed by a plating process affects electromigration (EM) and stress induced void (SIV) formation. According to C. H. Shih et al, a presence of impurity in a grain boundary of a copper film provides an improved SIV resistance, while an additive employed for forming impurity of copper provides a deteriorated EM resistance. As described above, an improvement in SIV resistance and an improvement in EM resistance is a trade off, and thus simultaneous enhancements of both resistances can not be achieved in conventional technologies. In the configurations described in above-described conventional technologies, simultaneous improvements in both SIV resistance and EM resistance can not be achieved.

SUMMARY OF THE INVENTION

According to one aspect of the present invention, there is provided a semiconductor device, comprising: a semiconductor substrate; an insulating film formed on or over said semiconductor substrate; a barrier metal film, formed on said insulating film, and being capable of preventing copper from diffusing into said insulating film; and an electrically conducting film formed on said barrier metal film so as to be in contact with the barrier metal film, and containing copper, a metal having a standard electrode potential that is lower than that of copper, and carbon, wherein distribution of carbon concentration along a depositing direction in said electrically conducting film includes a first peak and a second peak, and wherein said metal having a standard electrode potential that is lower than that of copper is contained in an interface between said electrically conducting film and said barrier metal film at higher concentration than in other regions.

Here, the first peak and the second peak may provide local maximum values in the distribution of carbon concentration. Further, it may be configured that the first peak and the second peak appear at positions that are not included in the interface between the electrically conducting film and the barrier metal film. Further, it may be configured that carbon concentrations at the first peak and the second peak are higher than carbon concentration in the interface between the copper-containing electrically conducting film and the barrier metal film.

In order to enhance SIV resistance, carbon concentration in the electrically conducting film containing copper (hereinafter referred to as "copper-containing electrically conducting film") may preferably be increased. This configuration can provide a reduced stress relaxation due to unconformity of grain boundaries or a decrease in dislocation energy in the copper-containing electrically conducting film, thereby providing an improved SIV resistance. Further, a distortion due to a thermal expansion can be moderated by increasing carbon concentration in the copper-containing electrically conducting film. Since a distortion due to stress migration can be easily created in the interface with the copper-containing electrically conducting film, the copper-containing electrically conducting film may have higher carbon concentration in the interface with the barrier metal film as possible, in order to enhance a SIV resistance of the copper-containing electrically conducting film.

Meanwhile, in order to provide better EM resistance, the copper-containing electrically conducting film may be preferably configured to have lower carbon concentration in the interface with the barrier metal film. Further, in order to maintain lower electrical resistivity of the copper-containing electrically conducting film, it is preferable to have a carbon concentration in the copper-containing electrically conducting film that is not very high.

Such configuration of the semiconductor device according to the present invention achieves distributed positions of a plurality of peaks in the carbon concentration in the copper-containing electrically conducting film. This configuration can provides an enhanced SIV resistance for the copper-containing electrically conducting film, while maintaining a relatively lower concentration of carbon in the copper-containing electrically conducting film. Further, in the configuration of the semiconductor device according to the present invention, the metal having a standard electrode potential that is lower than that of copper is contained in the electrically conducting film. Further, the metal having a standard electrode potential that is lower than that of copper is contained in an interface of the electrically conducting film with the barrier metal film at higher concentration than in other regions. This configuration provides an improved adhesiveness between the electrically conducting film and the barrier metal film, while controlling an increase in the resistance of the electrically conducting film, therefore, an improved SIV resistance can be provided without deteriorating the EM resistance.

According to another aspect of the present invention, there is provided a method for manufacturing a semiconductor device, comprising: forming a concave portion in an insulating film formed on or over a semiconductor substrate; forming a barrier metal film in the concave portion; forming a seed metallic film in the concave portion, the seed metallic film containing copper, a metal having a standard electrode potential that is lower than that of copper; and filling the concave portion with a plated film containing copper by an electrolytic plating process utilizing the seed metallic film as an electrode and employing a copper plating solution that contains a polymer having molecular weight equal to or more than 500 to equal to or less than 2,000 as an inhibitor, wherein the fills the concave portion with the plated film includes: a first operation for performing the electrolytic plating process by utilizing a first current density; and a second operation for performing the electrolytic plating process by utilizing a current density that is higher than the first current density, after the first operation, and wherein, in the first operation and the second operation, carbon is injected in the seed metallic film and the plated film so that distributions of carbon concentration in depositing direction in the seed metallic film and in the plated film have a first peak and a second peak.

A present inventors have made an attempt on achieving simultaneous improvements in both of the SIV resistance and the EM resistance, which are in a relationship of a trade-off, and thus a procedure for manufacturing the copper-containing metallic film of the semiconductor device has been investigated in various ways. As a result of the investigations, the inventors have found that the semiconductor device, which is configured that the distribution of carbon concentration along the depositing direction in the copper-containing electrically conducting film includes the first peak and the second peak, can be obtained by the above-described manufacturing process. It can be achieved by conducting such process that peaks in the carbon concentration appear at positions that are closer to the interface of the copper-containing electrically conducting film and the barrier metal film, thereby providing further improved SIV resistance. Further, a reduced carbon concentration in interface between the copper-containing electrically conducting film and the barrier metal film can be maintained, so that an enhanced SIV resistance can be provided without deteriorating the EM resistance. Further, a relatively higher carbon concentration between the first peak and the second peak can be maintained, thereby providing an enhanced SIV resistance. Further, by conducting such method, a continuously uniform two-dimensional carbon concentration profile in the copper-containing electrically conducting film formed on the barrier metal film can be obtained along the barrier metal film. This configuration provides an improved adhesiveness between the copper-containing electrically conducting film and the barrier metal film in both the bottom surface and the side surface of the copper-containing electrically conducting film, thereby providing an enhanced EM resistance. Further, further improved SIV resistance can also be provided.

According to the present invention, an improved SIV resistance and an improved EM resistance can be achieved in the coupling structure containing copper films.

BRIEF DESCRIPTION OF THE DRAWINGS

The above and other objects, advantages and features of the present invention will be more apparent from the following description taken in conjunction with the accompanying drawings, in which.

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be repeated.

Figure 1:
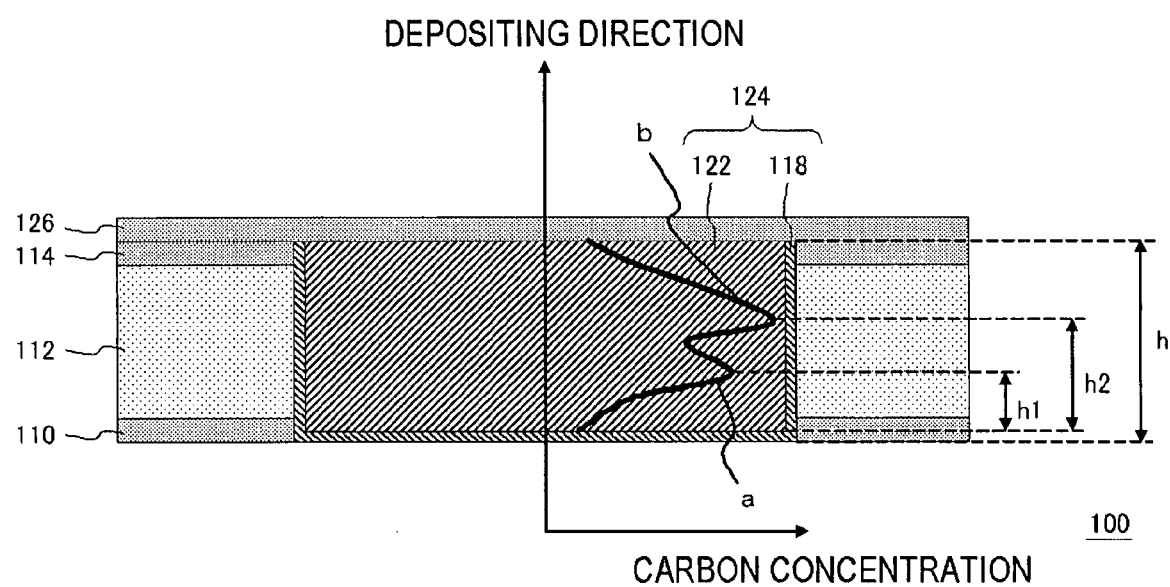
FIG. 1 is a cross-sectional view, partially illustrating a configuration of a semiconductor device in an embodiment of the present invention.

FIG. 1 is a cross-sectional view, partially illustrating a configuration of a semiconductor device in the present embodiment.

A semiconductor device 100 includes a semiconductor substrate (not shown) having electronic elements such as a transistor or the like formed therein, and also includes an etching stopper film 110, a second insulating layer 112, a protective insulating film 114 and a cap insulating film 126, which are formed on or over the semiconductor substrate in this order. Further, an interconnect trench is formed to extend over the etching stopper film 110, the second insulating layer 112 and the protective insulating film 114, and an interconnect 124 composed of a second barrier metal film 118 and a second electrically conducting film 122 is formed in such interconnect trench.

In the present embodiment, the second electrically conducting film 122 has the following configuration. The second electrically conducting film 122 contains copper as a major constituent. Further, the second electrically conducting film 122 contains carbon. As illustrated in FIG. 1, a distribution of carbon concentration along a depositing direction of the second electrically conducting film 122 includes a first peak "a" and a second peak "b".

Further, the second electrically conducting film 122 further contains a metal having a standard electrode potential that is lower than that of copper such as aluminum (Al), tin (Sn), titanium (Ti) and the like. In addition to above, Al may preferably be employed for the metal having a standard electrode potential that is lower than that of copper. Such configuration provides maintaining a lower resistance of the second metallic film 122. The metal having a standard electrode potential that is lower than that of copper is contained in an interface of the second electrically conducting film 122 with the second barrier metal film 188 at higher concentration than in other regions.

Further, in the present embodiment, the second barrier metal film 118 contains a refractory metal such as, for example, Ti, tungsten (W), tantalum (Ta) and the like. Preferable barrier metal film may be a film of, for example, Ti, titanium nitride (TiN), W, tungsten nitride (WN), Ta, tantalum nitride (TaN) and the like. Further, multiple-layered film of these films may also be employed.

The second insulating layer 112 may be configured of a low dielectric constant film. The second insulating layer 112 may be composed of, for example, silicon oxycarbide (SiOC). The etching stopper film 110 may be composed of silicon carbide (SiC), silicon carbonitride (SiCN), SiOC or silicon oxynitride (SiON). The protective insulating film 114 functions as protecting the second insulating layer 112 in a CMP process in the process for forming the interconnect 124. The protective insulating film 114 may be composed of, for example, a silicon oxide film. The cap insulating film 126 may be composed of, for example, SiCN.

Next, the procedure for manufacturing the semiconductor device 100 will be described. FIGS. 2A and 2B, FIGS. 3A and 3B and FIGS. 4A and 4B are cross-sectional views of a semiconductor device, illustrating a procedure for manufacturing the semiconductor device 100 in the present embodiment. Although it is not shown in FIG. 1, the first insulating layer 102 is formed over the semiconductor substrate of the semiconductor device 100, and the etching stopper film 110 is formed on the first insulating layer 102. A via 104 composed of a first barrier metal film 106 and a first electrically conducting film 108 is formed in the first insulating layer 102.

First of all, the first insulating layer 102 is formed over the semiconductor substrate (not shown). The first insulating layer 102 may be composed of a silicon oxide film or a low dielectric constant film similarly as the film for composing the second insulating layer 112. Although it is not shown in the diagrams, the first insulating layer 102 may be configured of containing an etching stopper film and/or a protective insulating film. Subsequently, a via hole is formed in the first insulating layer 102, and the first barrier metal film 106 is formed in the via hole. Subsequently, in the via hole, the first electrically conducting film 108 is formed on the first barrier metal film 106. The method for manufacturing the first barrier metal film 106 and the first electrically conducting film 108 may be similar to the method for manufacturing the second barrier metal film 118 and the second electrically conducting film 122 as will be discussed later. Thereafter, portions of the first electrically conducting film 108 and the first barrier metal film 106 deposited outside of the via hole are removed by a CMP process to form the via 104.

Subsequently, the etching stopper film 110, the second insulating layer 112 and the protective insulating film 114 are deposited on the via 104 by a CVD process. This procedure provides a structure shown in FIG. 2A. Here, the etching stopper film 110 may be composed of SiCN, the second insulating layer 112 may be composed of SiOC, and the protective insulating film 114 may be composed of $SiO_2$.

Figure 2A:
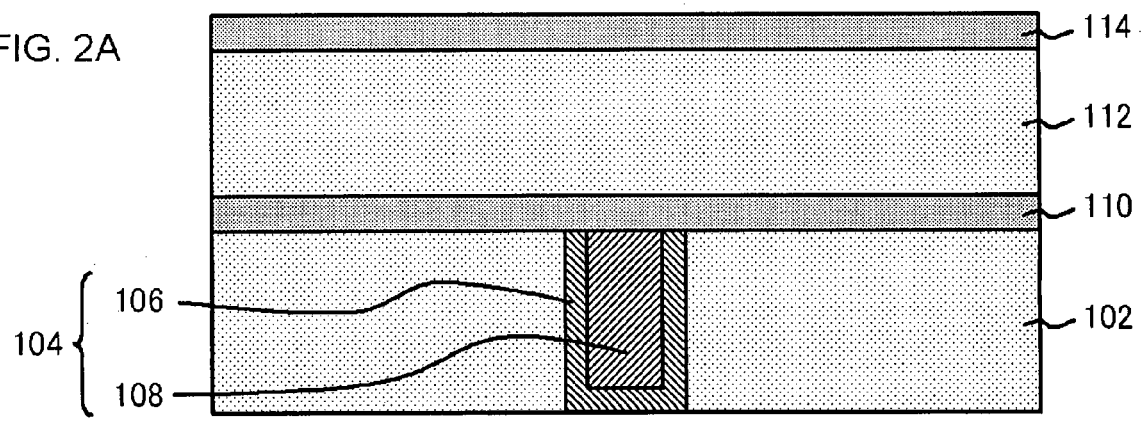
FIGS. 2A and 2B are cross-sectional views of a semiconductor device, illustrating a procedure for manufacturing the semiconductor device in an embodiment of the present invention.
Figure 2B:
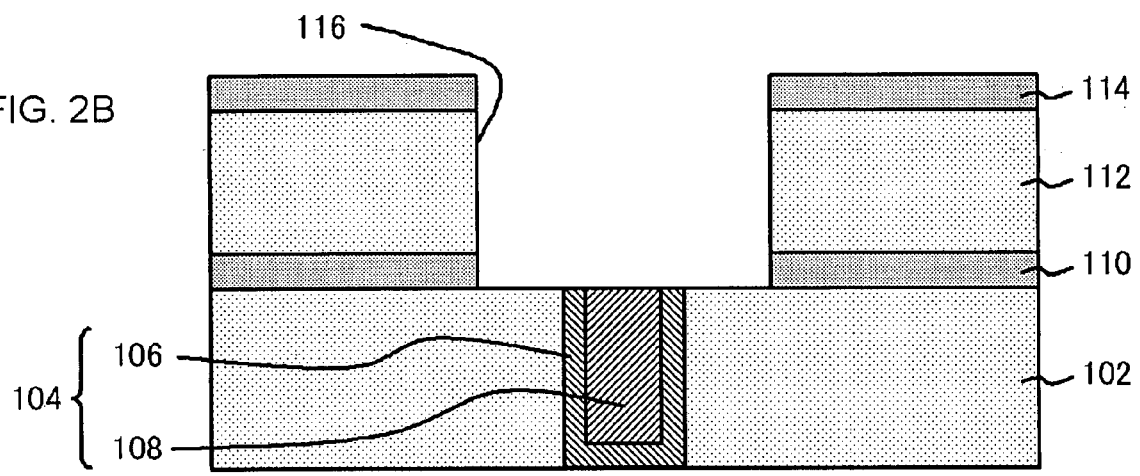

Subsequently, an interconnect trench 116 is formed to extend through the protective insulating film 114, the second insulating layer 112 and the etching stopper film 110 by a known lithographic technology and a dry etching process (FIG. 2B). Having such procedure, the via 104 is exposed. A height of the interconnect trench 116, may be about equal to or more than 200 nm to equal to or less than 5,000 nm.

Figure 3A:
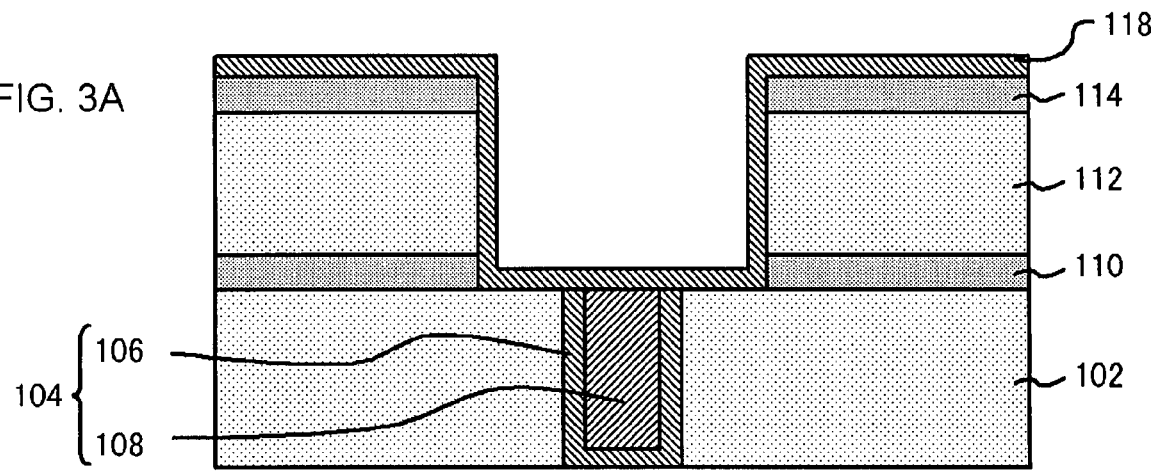
FIGS. 3A and 3B are cross-sectional views of the semiconductor device, illustrating the procedure for manufacturing the semiconductor device in the embodiment of the present invention.

Thereafter, the second barrier metal film 118 is formed over the entire surface of the semiconductor substrate by an atomic layer deposition (ALD) process, a CVD process or a physical vapor deposition (PVD) process (FIG. 3A). A film thickness of the second barrier metal film 118 may be about equal to or more than 1 nm to equal to or less than 100 nm.

Figure 3B:
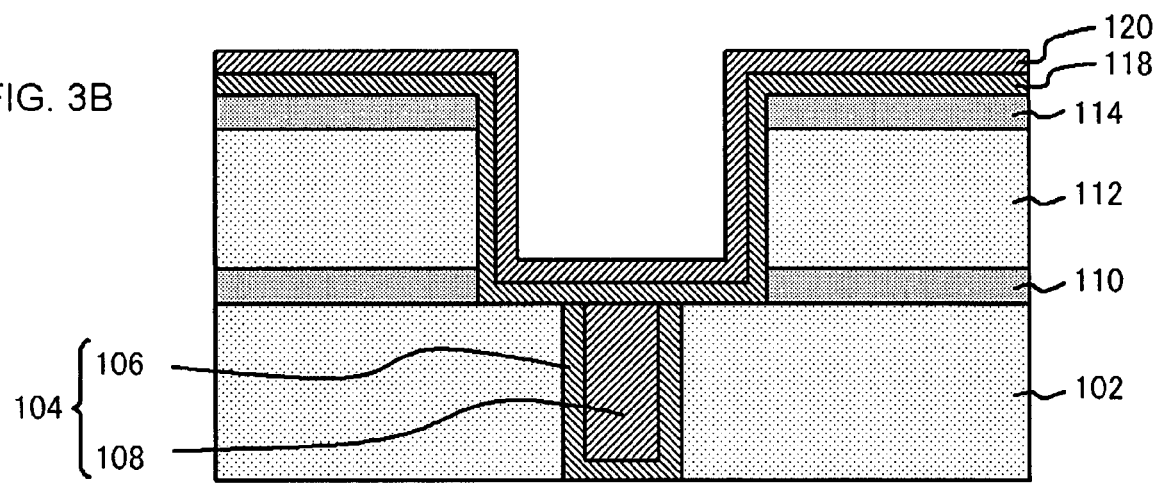

Thereafter, a seed metallic film 120 containing copper and a metal having a standard electrode potential that is lower than that of copper is formed on the second barrier metal film 118 by a PVD process such as a sputter process and the like (FIG. 3B). The seed metallic film 120 may be formed by sputtering an alloy of copper and the metal having a standard electrode potential that is lower than that of copper. When the metal having a lower standard electrode potential is Al, Sn or Ti, content of the metal having lower standard electrode potential in the seed metallic film 120 may be within a range between 0.1 and 5 atomic %. A film thickness of the seed metallic film 120 may be within a range between about 35 nm and 75 nm. The interconnect trench 116 is partially filled with such film.

Subsequently, a plated film 121 is formed via a plating process. The procedure for forming the plated film 121 will be described as follows. A plating solution available in the present invention may contain copper and an additive such as an accelerator, an inhibitor and the like. In the present embodiment, the plating solution contains an inhibitor, which is a polymer such as, for example, polyethylene glycol having a molecular weight equal to or more than 500 to equal to or less than 2,000. Besides it, the plating solution may be same as an ordinal plating solution for forming a copper containing interconnect. For example, a concentration of copper in the plating solution may be within a range between 40 and 60 g/liter.

The semiconductor substrate is placed into a bath of such plating solution, and the plated film 121 is formed by an electrolytic plating process by utilizing the seed metallic film 120 as a cathode electrode. Here, a current density (first current density) at the time of placing the semiconductor substrate into the bath is set to be within a range equal to or more than 3 mA/cm$^2$ to below 20 mA/cm$^2$, and more preferably a range equal to or more than 3 mA/cm$^2$ to below 10 mA/cm$^2$. Here, "at the time of placing the semiconductor substrate in the bath" is not limited to a moment of the semiconductor substrate (wafer) contacting with the solution, but means, for example, a time within a range of from the time of contacting with the solution to around 10 seconds thereafter.

Figure 4A:
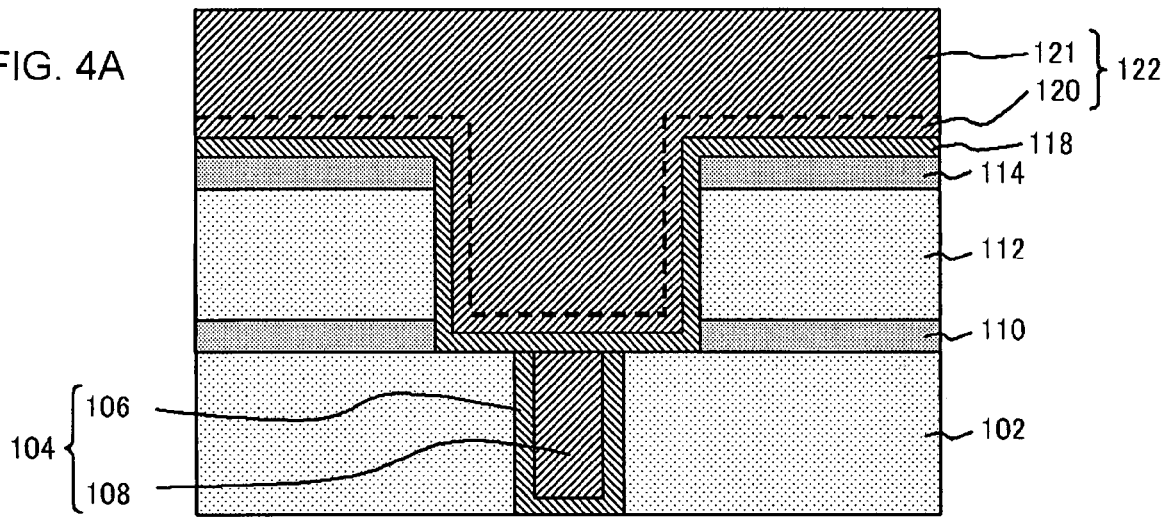
FIGS. 4A and 4B are cross-sectional views of the semiconductor device, illustrating the procedure for manufacturing the semiconductor device in the embodiment of the present invention.

Further, trenches in a fine pattern are filled, and then, the current density is increased to a level within a range equal to or more than 20 mA/cm$^2$ to equal to or less than 100 mA/cm$^2$, and more preferably to a level within a range equal to or more than 25 mA/cm$^2$ to equal to or less than 50 mA/cm$^2$. The current density after the filling may be 3-folds to 5-folds of the current density at the time of placing the semiconductor substrate in the bath. In this way, the interconnect trench 116 is filed with the second electrically conducting film 122 composed of the seed metallic film 120 and the plated film 121 (FIG. 4A). A film thickness of the plated film 121 formed by a plating process may be about 500 nm to 4,000 nm.

Then, the semiconductor substrate is heat-treated within a hydrogen containing nitrogen atmosphere at a temperature of about equal to or higher than 250 degree C. Here, the temperature for the thermal processing may be equal to or lower than 400 degree C. Further, a hydrogen concentration in such atmosphere for the thermal processing may be equal to or larger than 0.01 vol. %. Besides, although an upper limit of the hydrogen concentration is not particularly limited, a typical hydrogen concentration may be, for example, equal to or lower than 10 vol. %.

Carbon from the inhibitor is carried in the second electrically conducting film 122 by the above-mentioned processing, thereby providing the configuration that the distribution of carbon concentration in the second electrically conducting film 122 includes the first peak and the second peak. Here, it may be configured that the first peak (h1 in FIG. 1) appears a position of a height equal to or more than 50 nm to equal to or less than 100 nm from the interface thereof with the second barrier metal film 118. As described above, an improved adhesiveness between the second metallic film 122 and the second barrier metal film 118 can be presented while enhancing SIV resistance, by employing the configuration, in which the first peak in the distribution of carbon concentration appears in vicinity of the contact surface with the second barrier metal film 118. This configuration can provide an enhanced SIV resistance while maintaining better EM resistance of the second metallic film 122. Further, it may be configured that the second peak (h2 of FIG. 1) appears at a position of a height equal to or more than 0.75 h to equal to or less than 0.9 h from the interface thereof with the second barrier metal film 118, provided that h is a height of the interconnect height (depth of interconnect trench). In addition, it may also be configured that the second peak appears at a position under the upper surface of the second electrically conducting film 122 below the cap insulating film 126. More specifically, summation of h2 in FIG. 1 and the film thickness of the second barrier metal film 118 may be less than h. As described above, an improved adhesiveness between the second metallic film 122 and the upper layer thereof can be presented while enhancing SIV resistance, by employing the configuration, in which the second peak of the distribution of carbon concentration in the second electrically conducting film 122 appears in vicinity of the contact surface with the upper layer thereof. This configuration can provide an enhanced SIV resistance while maintaining better EM resistance of the second metallic film 122. The position of the second peak may be adjusted by controlling a timing for applying a voltage having the current density, after filling the fine pattern by forming the plated film 121.

Figure 9:
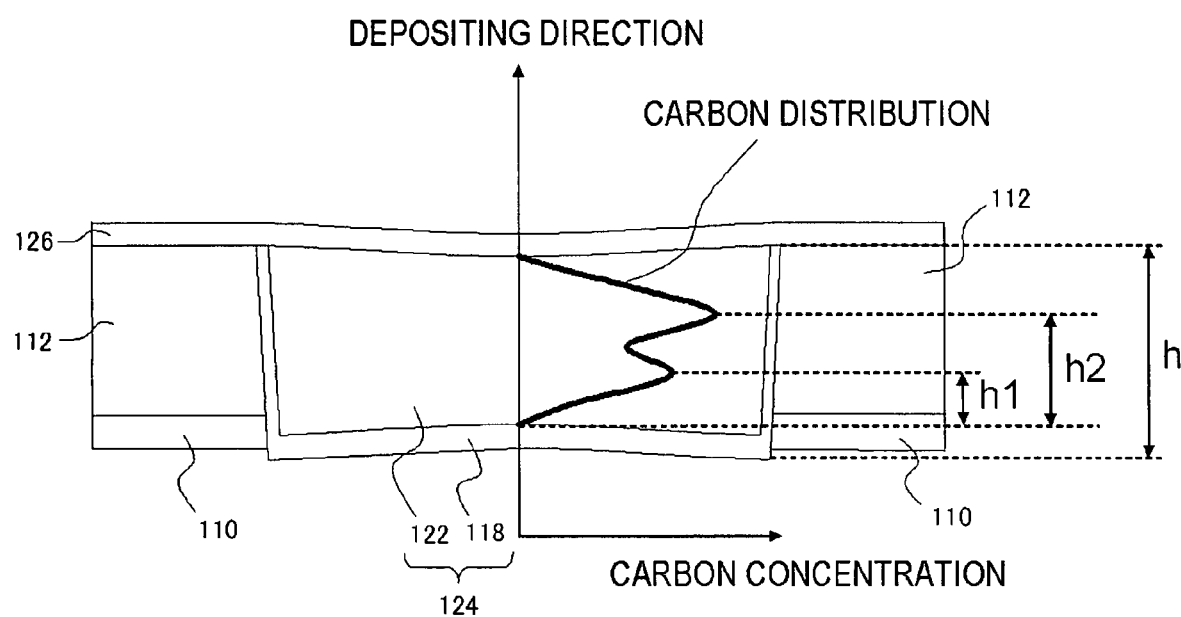
FIG. 9 is a cross-sectional view, partially illustrating a configuration of a semiconductor device in an embodiment of the present invention.

FIG. 9 is a cross-sectional view, schematically illustrating a configuration of an actual semiconductor device. As shown, a difference in height may appears in the interconnect 124 between a center section and an end (or edge) portion. In the present embodiment, a height h of the interconnect can be set equivalent to a depth of the end portion of the interconnect trench 116. Further, the position h1 of the first peak and the position h2 of the second peak may be presented by distances from the interface between the second barrier metal film 118 and the second metallic film 122 in the central portion of the interconnect 124.

Carbon concentration at the second peak may be almost equivalent to or larger than carbon concentration at the first peak. This configuration can provide an improved SIV reliability in the side of the front surface, which has no barrier metal thereon and therefore involves lower SIV reliability than the side of the interface. Carbon concentration in the second peak may be adjusted by controlling a timing for applying a voltage having the current density, after filling the fine pattern by forming the plated film 121.

It is considered that the reasons for obtaining the configuration, in which a distribution of carbon concentration in the second electrically conducting film 122 has the first peak and the second peak as described above, are the following.

Primarily, when the plated film 121 is prepared, an additive in the plating solution is bound to chlorine, causing a chemical absorption of the resultant compound to a surface of the seed metallic film 120. Here, the metal having a standard electrode potential that is lower than that of copper is more electron-release-able to supply electron to the additive in the plating solution, as compared with copper. As a result, the metal having a standard electrode potential that is lower than that of copper is more reactive with the additive, thereby achieving a creation of stronger ionic bond. Further, a field strength in the plating solution can be increased, by setting a relatively higher current density at the time of placing thereof in the bath to be within a range equal to or more than 3 mA/cm$^2$ to lower than 20 mA/cm$^2$, and more preferably a range equal to or more than 3 mA/cm$^2$ to lower than 10 mA/cm$^2$. A concentration of the additive in the plating solution around the seed metallic film 120 can be increased than a general condition by conducting these procedures. Further, since a polymer of relatively smaller molecular weight is employed as an inhibitor, carbon in the inhibitor is easily taken in the second electrically conducting film 122. Therefore, an uptake quantity of carbon into the second electrically conducting film 122 can be increased. As described above, the first peak in the distribution of carbon concentration is formed at the initial stage in the process for forming the second electrically conducting film 122.

Subsequently, the second peak of distribution of carbon concentration is formed by increasing the current density, after trenches in a fine pattern are filled, to a level of within a range equal to or more than 20 mA/cm$^2$ to equal to or less than 100 mA/cm$^2$, and more preferably to a level of within a range equal to or more than 25 mA/cm$^2$ to equal to or less than 50 mA/cm$^2$.

During a thermal processing performed later on, the impurity metal (whose standard electrode potential is lower than that of copper) in the seed metallic film 120 tends to diffuse into the plated film 121. Corresponding to such phenomenon, a pore is formed near the interface between the seed metallic film 120 and the plated film 121, leading to diffusing elemental carbon into the pore. This configuration can provide further increased carbon concentration in the first peak appearing in vicinity of the interface with the seed metallic film 120. By performing a thermal processing within a hydrogen atmosphere, a diffusion of the metal having lower standard electrode potential and/or carbon is facilitated, so that the process performed at lower temperature for shorter time can be achieved.

Figure 4B:
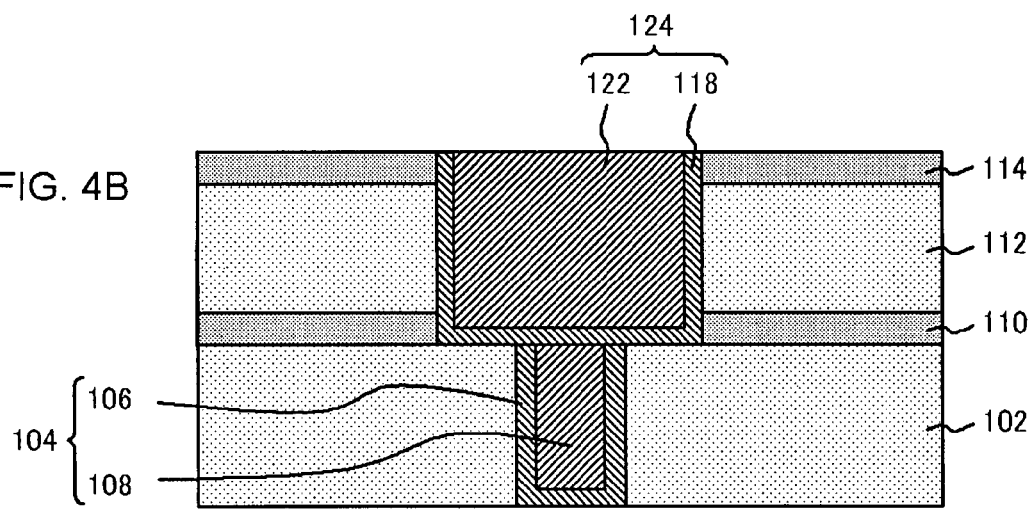

Thereafter, portions of the second electrically conducting film 122 and the second barrier metal film 118 deposited outside of the interconnect trench 116 are removed by a CMP process. This configuration provides the interconnect 124 (FIG. 4B). Subsequently, a cap insulating film 126 is formed on the interconnect 124.

The multiple-layered interconnect structure can be formed by repeating the above-mentioned process.

EXAMPLES

Hereinafter, the configurations of the above-mentioned embodiments will be further described in detail by illustrating specific examples. In example 1 and example 2, semiconductor devices were manufactured in a procedure same as that described in reference to FIG. 2 to FIG. 4 in the above-mentioned embodiments.

Example 1

The second barrier metal film 118 was configured to be formed by depositing a TaN film (film thickness of about 5 nm) and a Ta film (film thickness of about 10 nm) in this order. The seed metallic film 120 was composed of an alloy of copper and Al (Al content of 1 atomic %, film thickness of about 50 nm). The employed plating solution contained polyethylene glycol of molecular weight within a range equal to or more than 500 to equal to or less than 2,000. Further, the plating solution was also designed to contain copper at a concentration of 50 g/liter. The semiconductor substrate was placed in a bath containing such plating solution, and a current density at the time of placing the semiconductor substrate in the bath was set to be within a range equal to or more than 3 mA/cm$^2$ to less than 8 mA/cm$^2$. Further, after trenches in a fine pattern had been filled (about 2 minutes passed after placing the substrate into the bath), the current density was increased to a level of within a range equal to or more than 25 mA/cm$^2$ to equal to or less than 35 mA/cm$^2$.

Thereafter, thermal processing operations were performed under two conditions of: (i) within a hydrogen containing nitrogen atmosphere (hydrogen concentration of 4% vol.) at about 250 degree C. for about 30 seconds; and (ii) within a hydrogen containing nitrogen atmosphere (hydrogen concentration of 4% vol.) at about 350 degree C. for about 30 seconds. These results are respectively shown in FIG. 5A and FIG. 5B. Here, FIG. 5A through FIG. 7C are impurities profile in the interconnect film measured by SIMS (Secondary Ion Mass Spectroscopy). Horizontal axis is sputtering time and vertical axis is measured ion intensity. Zero (0) seconds corresponds to the metal surface. In each of these charts, a vertical dotted line indicates the interface between the seed metallic film 120 and the second barrier metal film 118. Also in each of these charts, left side corresponds to the upper layer.

Figure 5A:
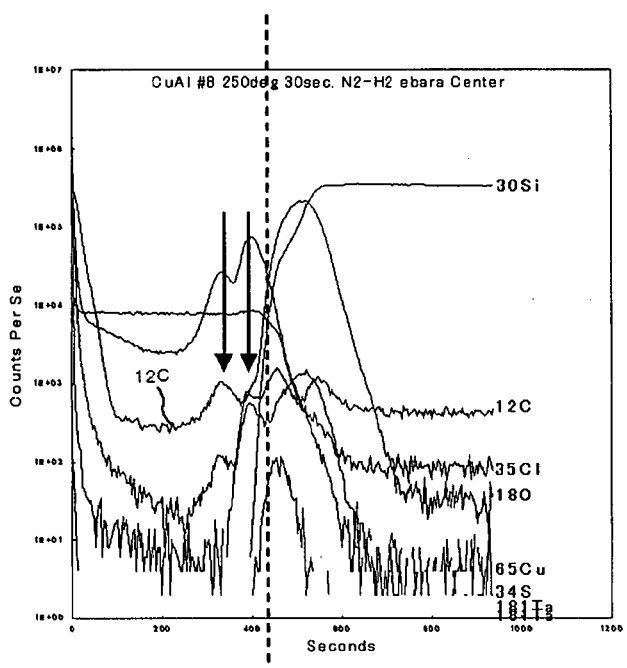
FIGS. 5A and 5B are charts, showing results of an example.
Figure 5B:
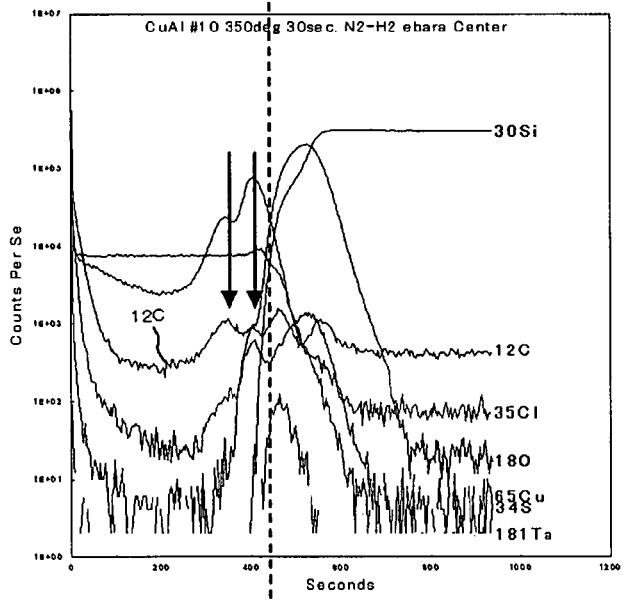

As shown in FIG. 5A and FIG. 5B, it was confirmed that, by performing the thermal processing within the hydrogen containing nitrogen atmosphere, the first peak of carbon concentration appeared at about 400 seconds (a position of about 70 nm from the interface with the second barrier metal film 118 (a position of 0.43 h, assuming that the interconnect height h was 200 nm)), and the second peak of carbon concentration appeared at about 350 seconds (a position of about 160 nm from the interface with the second barrier metal film 118 (a position of 0.8 h the second barrier metal film 118, assuming that the interconnect height h was 200 nm)).

Example 2

The present example was similarly performed as in example 1, except that the employed plating solution contained polyethylene glycol and polypropylene glycol of molecular weight within a range equal to or more than 500 to equal to or less than 2,000. Except for such formulation of the plating solution, the semiconductor device 100 was manufactured similarly as example 1. Thermal processing operations were performed under three conditions of: (i) within a hydrogen containing nitrogen atmosphere (hydrogen concentration of 4% vol.) at about 250 degree C. for about 30 seconds; (ii) within a hydrogen containing nitrogen atmosphere (hydrogen concentration of 4% vol.) at about 350 degree C. for about 30 seconds; and (iii) within a nitrogen atmosphere at about 250 degree C. for about 30 minutes, similar as in example 1. These results are respectively shown in FIG. 6A to FIG. 6C. In each of these charts, a vertical dotted line indicates the interface between the seed metallic film 120 and the second barrier metal film 118. Also in each of these charts, left side corresponds to the upper layer.

Figure 6A:
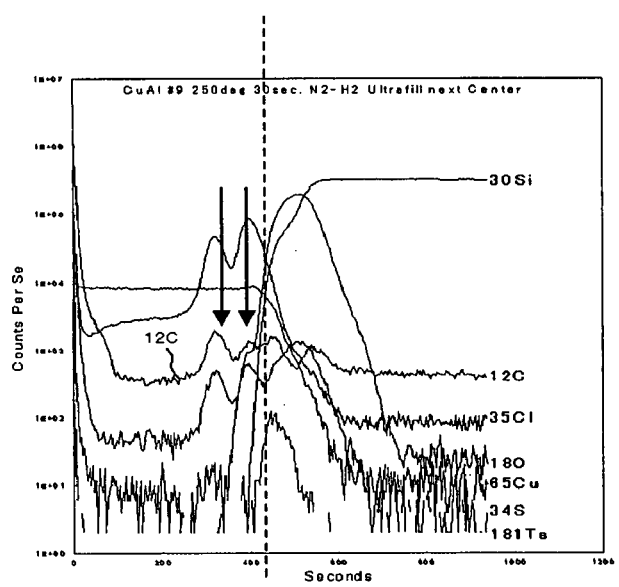
FIGS. 6A to 6C are charts, showing results of an example.
Figure 6B:
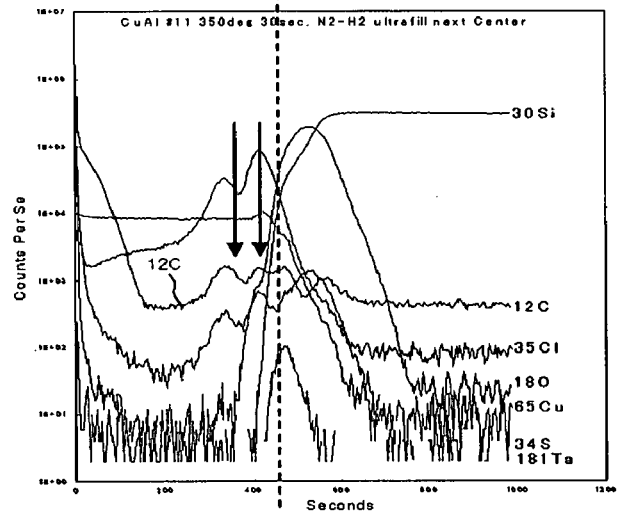

As shown in FIG. 6A and FIG. 6B, it was confirmed that, by performing the thermal processing within the hydrogen containing nitrogen atmosphere, the first peak of carbon concentration appeared at about 400 seconds (a position of about 70 nm from the interface with the second barrier metal film 118 (a position of 0.43 h, assuming that the interconnect height h was 200 nm)), and the second peak of carbon concentration appeared at about 350 seconds (a position of about 160 nm from the interface with the second barrier metal film 118 (a position of 0.8 h the second barrier metal film 118, assuming that the interconnect height h was 200 nm)).

Figure 6C:
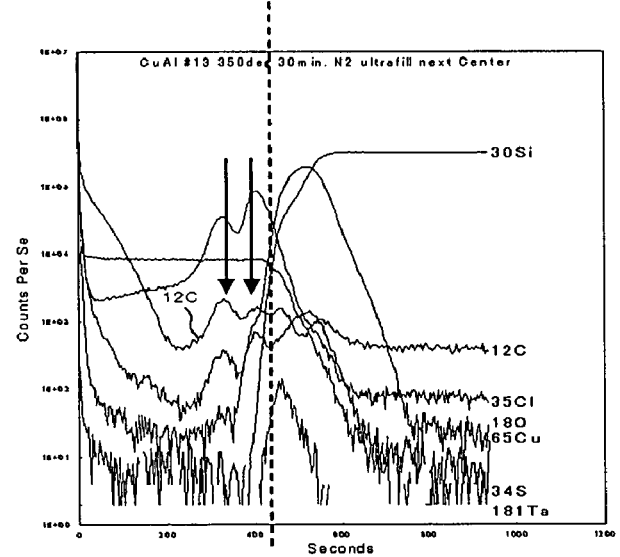

As shown in FIG. 6C, it was also confirmed that, even if the thermal processing was performed within the nitrogen atmosphere, the first peak of carbon concentration appeared at about 400 seconds (a position of about 70 nm from the interface with the second barrier metal film 118 (a position of 0.43 h, assuming that the interconnect height h was 200 nm)), by thermal processing was performed for longer processing time. Further, it was also confirmed that the second peak of carbon concentration appeared at about 350 seconds (a position of about 160 nm from the interface with the second barrier metal film 118 (a position of 0.8 h the second barrier metal film 118, assuming that the interconnect height h was 200 nm)).

Comparative Example

The seed metallic film 120 was composed of a copper film containing no Al in a comparative example. Further, the employed plating solution contained no polyethylene glycol or the like of molecular weight within a range equal to or more than 500 to equal to or less than 2,000 for the inhibitor. Except for such formulation of the plating solution, the semiconductor device 100 was manufactured similarly as example 1 or example 2. Thermal processing operations were performed under three conditions of: (i) within a hydrogen containing nitrogen atmosphere (hydrogen concentration of 4% vol.) at about 250 degree C. for about 30 seconds; (ii) within a hydrogen containing nitrogen atmosphere (hydrogen concentration of 4% vol.) at about 350 degree C. for about 30 seconds; and (iii) within a nitrogen atmosphere at about 250 degree C. for about 30 minutes, similarly as in example 2. These results are respectively shown in FIG. 7A to FIG. 7C. In each of these charts, a vertical dotted line indicates the interface between the seed metallic film 120 and the second barrier metal film 118. Also in each of these charts, left side corresponds to the upper layer.

Figure 7A:
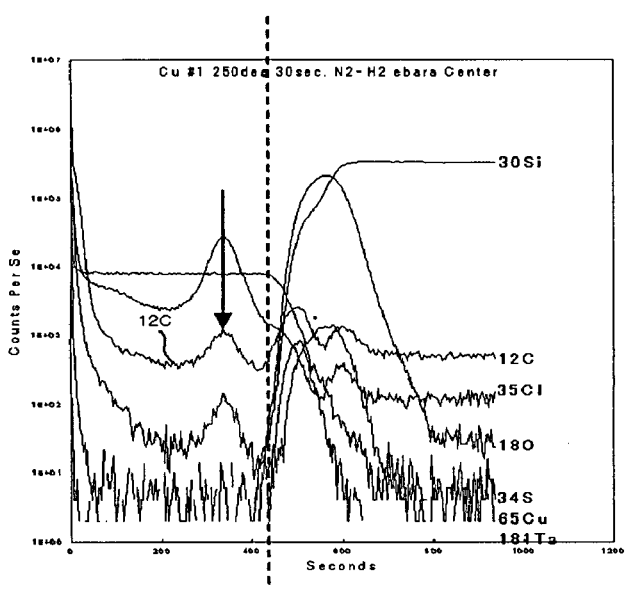
FIGS. 7A to 7C are charts, showing results of an example.
Figure 7B:
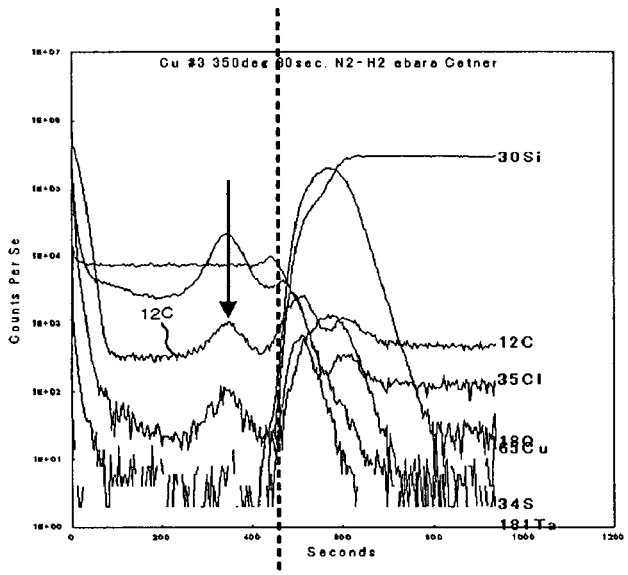
Figure 7C:
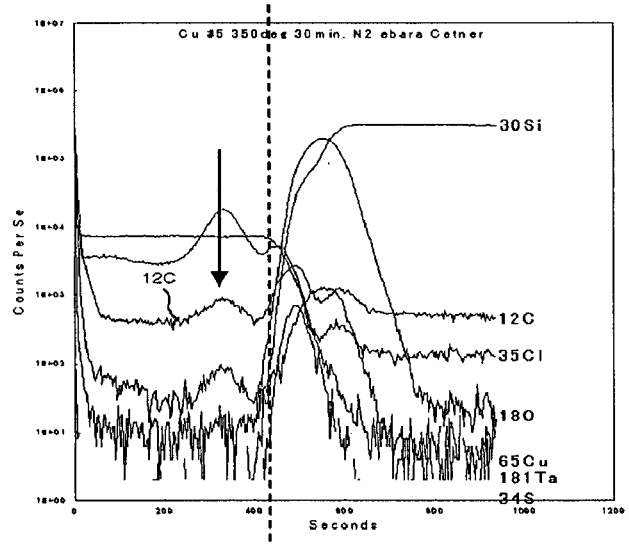

As shown in FIG. 7A to FIG. 7C, any peak corresponding to the first peak was not found in this example, although a peak corresponding to the second peak of example 1 and example 2 were found.

Figure 8:
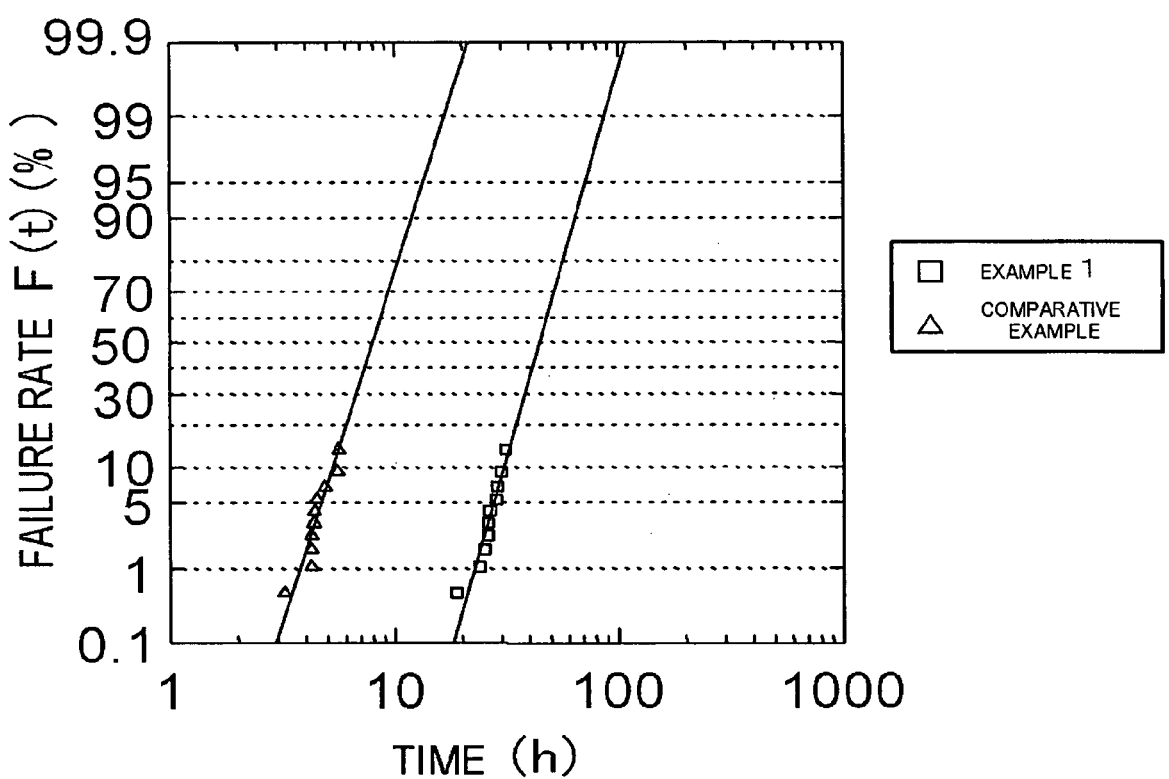
FIG. 8 is a graph, showing results of an example.

FIG. 8 is a graph, showing results obtained by measuring a relationship between a cumulative failure rate and the heating time by calculating employing a measured via chain resistance for the semiconductor device manufactured in example 1 (condition (i)) and comparative example (condition (i)). The failure rate was shown as a cumulative failure rate over a down time, assuming that the down time is determined as a duration time in the heating process until a time when a ramp rate of a via chain resistance is beyond a threshold value. In the semiconductor device prepared in example 1, a reduced failure rate over comparative example was shown.

It is to be understood that the invention is capable of using in various other combinations, modifications and environments, and any other interchanges in the expression between the method and device or the like according to the present invention may be effective as an alternative of an embodiment according to the present invention.

What is claimed is:

1. A semiconductor device, comprising:
   a semiconductor substrate;
   an insulating film formed on or over said semiconductor substrate;
   a barrier metal film, formed on said insulating film; and
   an electrically conducting film formed on said barrier metal film so as to be in contact with said barrier metal film, and containing copper, a metal having a standard electrode potential that is lower than that of copper, and carbon,
   wherein a distribution of carbon concentration along a depositing direction in said electrically conducting film includes a first peak and a second peak, and
   wherein said metal having a standard electrode potential that is lower than that of copper is contained in an interface between said electrically conducting film and said barrier metal film at higher concentration than in other regions.

2. The semiconductor device according to claim 1, wherein said metal having a standard electrode potential that is lower than that of copper is selected from a group consisting of aluminum (Al), tin (Sn) and titanium (Ti).

3. The semiconductor device according to claim 1,
   wherein said barrier metal film is formed on a bottom surface and a side surface of a concave portion formed in said insulating film,
   wherein said electrically conducting film is formed to fill said concave portion,
   wherein said first peak and said second peak appears in this order from the interface between said barrier metal film and said electrically conducting film, and
   wherein said first peak exists at a position of a height equal to or more than 50 nm to equal to or less than 100 nm from said interface.

4. The semiconductor device according to claim 2,
   wherein said barrier metal film is formed on a bottom surface and a side surface of a concave portion formed in said insulating film,
   wherein said electrically conducting film is formed to fill said concave portion,
   wherein said first peak and said second peak appears in this order from the interface between said barrier metal film and said electrically conducting film, and
   wherein said first peak exists at a position of a height equal to or more than 50 nm to equal to or less than 100 nm from said interface.

5. The semiconductor device according to claim 1,
   wherein said barrier metal film is formed on a bottom surface and a side surface of a concave portion formed in said insulating film,
   wherein said electrically conducting film is formed to fill said concave portion,
   wherein said first peak and said second peak appears in this order from a bottom surface of said concave portion, and
   wherein said second peak appears at a position of a height equal to or more than 0.75 h to equal to or less than 0.9 h from said interface between said barrier metal film and said electrically conducting film, provided that h is a depth of said concave portion.

6. The semiconductor device according to claim 2,
   wherein said barrier metal film is formed on a bottom surface and a side surface of a concave portion formed in said insulating film,
   wherein said electrically conducting film is formed to fill said concave portion,
   wherein said first peak and said second peak appears in this order from a bottom surface of said concave portion, and
   wherein said second peak appears at a position of a height equal to or more than 0.75 h to equal to or less than 0.9 h from said interface between said barrier metal film and said electrically conducting film, provided that h is a depth of said concave portion.

* * * * *